(12) United States Patent
Strout et al.

(10) Patent No.: US 8,537,561 B1
(45) Date of Patent: Sep. 17, 2013

(54) DISPLAY DEVICE MOUNTABLE ON AN AUTOMOTIVE VEHICLE, AND METHOD

(76) Inventors: Arthur Strout, Itasca, IL (US); Maurice Haff, Daytona Beach, FL (US)

( * ) Notice: Subject to any disclaimer, the term of this patent is extended or adjusted under 35 U.S.C. 154(b) by 0 days.

(21) Appl. No.: 13/594,959

(22) Filed: Aug. 27, 2012

Related U.S. Application Data

(60) Provisional application No. 61/610,836, filed on Mar. 14, 2012, provisional application No. 61/528,365, filed on Aug. 29, 2011.

(51) Int. Cl.
*H05K 5/00* (2006.01)

(52) U.S. Cl.
USPC ............... 361/752; 40/591; 116/54; 118/244; 134/6

(58) Field of Classification Search
USPC ............ 361/752; 40/591; 116/54; 118/244; 134/6
See application file for complete search history.

(56) References Cited

U.S. PATENT DOCUMENTS

| | | | |
|---|---|---|---|
| 1,506,797 A * | 9/1924 | Wessig | 116/54 |
| 2,591,337 A | 4/1952 | Cohen et al. | |
| 3,161,973 A | 12/1964 | Hastings et al. | |
| 5,255,464 A | 10/1993 | Marecek | |
| 5,456,753 A * | 10/1995 | Kuribayashi et al. | 118/244 |
| 5,878,516 A | 3/1999 | Amirian | |
| 6,918,200 B2 | 7/2005 | Pena | |
| 7,154,383 B2 | 12/2006 | Berquist | |
| 7,882,653 B2 | 2/2011 | Barlow | |
| 2002/0139394 A1 * | 10/2002 | Bronson | 134/6 |

* cited by examiner

*Primary Examiner* — Xiaoliang Chen
(74) *Attorney, Agent, or Firm* — Berenato & White, LLC

(57) ABSTRACT

A display device mountable on an automotive wiper arm positioned on the rear of an automotive vehicle, comprising a display panel having a front side for presentation of text or graphics and a back side for mounting a connector; arm-connector for affixing said display device to said automotive wiper arm; shaft for linking said arm-connector to said display panel; a shaft-connector for affixing said shaft to said display panel, said shaft-connector comprising part of said shaft; display-connector affixing said shaft to said display panel, said display-connector comprising said connector positioned on said display panel backside; wherein said shaft-connector and said display-connector are configured to lock together, substantially preventing separation of said display panel from said shaft during motion of said wiper arm during operation, wherein said arm-connector is configured to clasp said wiper arm and maintain sufficient pressure to avoid substantial rotation of said shaft around said wiper arm.

20 Claims, 10 Drawing Sheets

DISPLAY DEVICE MOUNTABLE ON AN AUTOMOTIVE VEHICLE, AND METHOD

CROSS REFERENCES TO RELATED APPLICATIONS

This application claims the benefit of U.S. Provisional Patent Application No. 61/528,365 filed on Aug. 29, 2011 and U.S. Provisional Patent Application No. 61/610,836 filed on Mar. 14, 2012 in the name of Arthur Strout, et al., which are expressly incorporated herein by reference each in its entirety.

BACKGROUND OF THE INVENTION

1. Field of the Invention

The present invention is related to display devices used to present text and graphics, and mountable on an automotive vehicle. More particularly, the present invention is directed to an apparatus mountable on a wiper arm and other attachment points of an automotive vehicle and associated method(s) for displaying text and graphics in physical form media such as that used to display personal messages and advertising.

2. Background of the Invention and Related Art

The purpose of displaying physical form media on automotive vehicles varies widely, and may be for typical intentions such as delivering a commercial message or impression, asserting a personal belief or perspective, supporting and promoting an organization or school, or simply for personal pleasure. In general, the intent of placing physical form media on an automotive vehicle is to capture the attention of observers so that the text or graphic displayed delivers the intended message; often reflecting the passion and interests of the presenter. Positioning of the physical form media on an automotive vehicle may depend on the target audience, such as pedestrians or other motorists. The desired period of observation may also be a factor in selecting the placement and type of physical form media, with three dimensional media placed on the top of a vehicle and two dimensional media placed on the rear of a vehicle providing relatively greater opportunity for observation during vehicle motion away from an observing pedestrian or by a following motorist.

Physical representations of personal messages and advertising information displayed on automotive vehicles appear in many forms in a variety of media, such as decals, magnetic signs, vehicle graphics, window mounted objects and signs, and banner displays. Some presentation media are designed to affix magnetically to the sides or rear of an automotive vehicle, and may be configured as flat two dimensional signs. Three dimensional presentation media, such as a banner display, is often mounted on top of a vehicle cab and may be permanently mounted with fasteners or temporarily mounted often magnetically or with suction cups and straps. Some presentation media may be internally illuminated or back lit to enable night time observation. Mounting a three dimensional display at the rear of a vehicle in a trailer hitch receiver requires use of a more costly fabrication material such as steel. Decals and vehicle graphics are typically applied to the sides and/or rear of an automotive vehicle, affixed to the windows or metal surfaces. Window mounted objects and signs may be affixed internally to the vehicle or externally by suction cup mounts or window glass edge clips. Effectiveness of physical form media in commanding attention of observers and delivering the intended message often varies with the type of physical form media employed and its placement on the vehicle, as well as message content and format. Marketing research has shown that three dimensional advertising is more memorable than two dimensional advertising. As reported by Darwin Creative (http://darwincreative.com), 58% of observers recalled seeing 3D displays as compared to 7% recalling 2D displays.

Magnetic signs, vehicle graphics, and decals do not provide the means for three dimensional displays on automotive vehicles. Three dimensional banners are generally flat signs mounted vertically with respect to the top or rear deck of a vehicle. While banner displays may be three dimensional in shape, such as the temporary displays typically used on top of privately owned vehicles employed for pizza delivery, the message displayed is not three dimensional. Three dimensional displays such as figurines are often large and costly. Mounting a three dimensional display on top of a vehicle is generally not at the eye level of an observer in a following vehicle and may require a physically larger device and message to assure capturing their attention and delivering the intended message. In addition, such a display on top of a vehicle is subject to high wind pressure during motion of the vehicle, requiring stronger attachment points than if less wind pressure were present, which can increase cost when compared to a smaller device that employs less substantial attachment mechanisms. Thus, a three dimensional display device mountable on the rear of an automotive vehicle, exposing the device to relatively less wind pressure, and located substantially at eye level of an observer in a following vehicle is needed to provide lower cost and effective physical media for presenting text and graphic messages in personal and commercial applications.

SUMMARY OF THE INVENTION

According to a broad aspect, the present invention provides a display device mountable on an automotive wiper arm, comprising a display panel having a front side for presentation of text or graphics and a back side for positioning one of a rotable connector or fixed connector, wherein said one of a rotable or fixed connector is configured to be attachable to said automotive wiper arm.

According to another broad aspect, the present invention provides a display device mountable on an automotive vehicle, comprising a display panel having a front side for presentation of text or graphics and a back side for mounting a connector. An arm-connector may be used for affixing the display device to at least a wiper arm of the automotive vehicle, along with a shaft linking the arm-connector to the display panel. A shaft-connector provides for affixing the shaft to the display panel, the shaft-connector comprising part of the shaft. A display-connector affixes the shaft to the display panel, the display-connector comprising the connector positioned on the display panel backside. The shaft-connector and the display-connector are configured to lock together after one is connected to the other, preventing separation of the display panel from the shaft during motion of the automotive vehicle and rotational motion of the wiper arm. The arm-connector may be configured to affix to the automotive wiper arm or other connection point and maintain sufficient pressure to avoid rotation of the shaft around and generally perpendicular to the automotive wiper arm or other connection point as a result of airflow pressure on the display panel during vehicular motion.

In other aspects of the present invention, the display-connector may be positioned asymmetrically on the backside of the display panel. In addition, the shaft-connector and the display-connector may be rotation-point connectors configured to allow the display panel to rotate on the shaft during movement of the automotive wiper arm. Asymmetric positioning of the display-connector and use of rotation point connectors serves to maintain orientation of the text or graphics present on the display panel relatively level with respect to the ground during rotational movement of the automotive wiper arm. Where a selected attachment point on a vehicle remains substantially stationary with respect to the vehicle, a rotation-point connector may be mechanically altered to maintain the display panel in a relatively fixed position.

According to a another broad aspect, the present invention provides a display device mountable at least on an automotive wiper arm, comprising a display panel having a front side for presentation of text or graphics and a back side for positioning a connector. An arm-connector affixes the display device to the automotive wiper arm or other connection point and a shaft links the arm-connector to the display panel. A first rotation-point connector affixes the shaft to the display panel, the rotation-point connector comprising part of the shaft. A second rotation-point connector affixed the shaft to the display panel, the second rotation-point connector comprising the connector positioned on the display panel backside. The first rotation-point connector is configured to insert into the second rotation-point connector and lock into the second rotation-point connector substantially preventing separation after connecting the first rotation-point connector to the second rotation-point connector. The first and second rotation-point connectors are configured to allow the display panel to rotate on the shaft during rotational movement of the automotive wiper arm.

In another aspect of the present invention, the second rotation-point connector may be positioned asymmetrically on the backside of the display panel, wherein orientation of the text or the graphics present on the display panel may be maintained relatively level with respect to the ground during movement of the automotive wiper arm.

In another aspect of the present invention, the display panel may be comprised of semi-flexible plastic material and may have a thickness in the range of 0.25 inches to 1.5 inches, the thickness being needed to maintain shape of the display panel depending on the stiffness characteristics of the semi-flexible plastic and the shape of the display panel.

In another aspect of the present invention, the display panel may be comprised of relatively rigid plastic material having a thickness in the range of 0.2 inches to 0.6 inches, the thickness being needed to maintain shape of the display panel depending on the stiffness characteristics of the rigid plastic and the shape of the display panel.

In another aspect of the present invention, the display panel is comprised of a plastic material configured with raised ridges on the backside to stiffen the display panel, the raised ridges radiating out from the second rotation-point connector.

In another aspect of the present invention, the display panel may be shaped in three dimensions to substantially conform to the shape of text and/or graphics presented on the display panel.

In another aspect of the present invention, the display panel may further comprise an electronic display enabling dynamic presentation or reconfiguration of text and/or graphics on the display panel, and which electronic display may be powered by an internal battery, the vehicle electrical system, solar cells, or a combination of these power sources.

In another aspect of the present invention, the first rotation-point connector may be conical in shape having an apex at a forward end away from the shaft and a base diameter greater than a shaft diameter at the point where the first rotation-point connector and the shaft are fastened together. In addition, the second rotation-point connector may comprise a conical shaped receptor configured to receive the first rotation-point connector, the second rotation-point connector further comprising an integrated base ring situated at the base dimension of the conical shaped receptor, the base ring having an inner circular opening with a diameter less than the base diameter. The base ring may be configured with slots that allow expansion of the conical shaped receptor during insertion of the first rotation-point connector.

In yet another aspect of the present invention, the first rotation-point connector may comprise a conical shaped tip having an apex at a forward end situated away from the shaft and a plurality of flexible tip extenders divided from each other and extending angularly back toward the shaft and away from the conical shaped tip, the plurality of flexible tip extenders configured in a conical shape having an apex comprised of the conical shaped tip and a base diameter at outer ends of the flexible tip extenders greater than a shaft diameter at the point where the first rotation-point connector and the shaft are fastened together. In addition, the second rotation-point connector may comprise a conical shaped receptor configured to receive the first rotation-point connector, the second rotation-point connector further comprising an integrated base ring situated at the base dimension of the conical shaped receptor, the base ring having an inner circular opening with a diameter less than the base diameter comprised of the outer ends of the flexible tip extenders.

In another aspect of the present invention, the display device is mounted on an automotive wiper arm that is a component of an automotive windshield wiper system situated on the rear of an automotive vehicle, the automotive vehicle typically being one within a class of vehicles comprising one of sport utility vehicles, cross-over vehicles, trucks, vans, and recreational vehicles. In addition, the display panel of the display device may be weighted to provide a righting moment and promote a pendulum effect substantially positioning the second rotation-point connector above a lower portion of the display panel throughout the range of motion of the automotive wiper arm during operation of the automotive windshield wiper system.

According to a another broad aspect, the present invention provides a display device mountable on an automotive wiper arm, comprising a display panel having a front side for presentation of text or graphics and a back side for positioning a connector, an arm-connector for affixing the display device to the automotive wiper arm, a shaft for linking the arm-connector to the display panel, a shaft-connector for affixing the shaft to the display panel, the shaft-connector comprising part of the shaft, and a display-connector for affixing the shaft to the display panel, the display-connector comprising the connector positioned on the display panel backside. The arm-connector is configured to attach to the automotive wiper arm and maintain sufficient connective pressure to avoid rotation of the shaft around and perpendicular to the automotive wiper arm as a result of airflow pressure on the display panel during vehicular motion. The shaft-connector is a first rotation-point connector and the display-connector is a second rotation-point connector, and the second rotation-point connector is positioned asymmetrically on said backside of the display panel. The first rotation-point connector is configured to insert into the second rotation-point connector and lock into the second rotation-point connector substantially preventing separation after connecting the first rotation-point connector to the second rotation-point connector. The first and second rotation-point connectors are configured to allow the display panel to rotate on the shaft during rotational movement of the automotive wiper arm operated by the windshield wiper system.

In another aspect of the present invention, the first rotation-point connector may be conical in shape having an apex at a forward end away from the shaft and a base diameter greater than a shaft diameter at the point where the first rotation-point connector and the shaft are fastened together. In addition, the second rotation-point connector may comprise a conical shaped receptor configured to receive the first rotation-point connector, the second rotation-point connector further comprising an integrated base ring situated at the base dimension of the conical shaped receptor, the base ring having an inner circular opening with a diameter less than the base diameter. The base ring may be configured with slots that allow expansion of the conical shaped receptor during insertion of the first rotation-point connector.

In another aspect of the present invention, the first rotation-point connector may comprise a conical shaped tip having an apex at a forward end situated away from the shaft and a plurality of flexible tip extenders divided from each other and extending angularly back toward the shaft and away from the conical shaped tip, the plurality of flexible tip extenders configured in a conical shape having an apex comprised of the conical shaped tip and a base diameter at outer ends of the flexible tip extenders greater than a shaft diameter at the point where the first rotation-point connector and the shaft are fastened together. In addition, the second rotation-point connector may comprise a conical shaped receptor configured to receive the first rotation-point connector, the second rotation-point connector further comprising an integrated base ring situated at the base dimension of the conical shaped receptor, the base ring having an inner circular opening with a diameter less than the base diameter comprised of the outer ends of the point extenders.

In another aspect of the present invention, the display panel may be weighted to provide a righting moment and promote a pendulum effect substantially positioning the second rotation-point connector above a lower portion of the display throughout the range of motion of the automotive wiper arm during operation of the automotive windshield wiper system.

In another aspect of the present invention, the first rotation-point connector may comprise a conical shaped tip having an apex at a forward end situated away from the shaft and a plurality of flexible tip extenders divided from each other and extending angularly back toward the shaft and away from the conical shaped tip, the plurality of flexible tip extenders configured in a conical shape having an apex comprised of the conical shaped tip and a base diameter at outer ends of the flexible tip extenders greater than a shaft diameter at the point where the first rotation-point connector and the shaft are fastened together. In addition, the second rotation-point connector may comprise a cylindrical hole penetrating through and asymmetrically positioned on the display panel and configured to receive the first rotation-point connector, the second rotation-point connector having an inner circular opening with a diameter less than the base diameter comprised of the outer ends of the flexible tip extenders. In addition, the shaft may be configured with an enlargement of the shaft diameter positioned away from the apex tip and flexible tip extenders to provide a stop against which the back side of the display panel can rest.

In another aspect of the present invention, the first rotation-point connector may comprise a conical shaped tip having an apex at a forward end situated away from the shaft and a base diameter greater than a shaft diameter at the point where the first rotation-point connector and the shaft are fastened together. In addition, the second rotation-point connector may comprise a cylindrical hole penetrating through and asymmetrically positioned on the display panel and configured to receive the first rotation-point connector, the second rotation-point connector having an inner circular opening with a diameter less than the base diameter of the first rotation-point connector. In addition, the shaft may be configured with an enlargement of the shaft diameter positioned away from the apex tip to provide a stop against which the back side of the display panel can rest.

DETAILED DESCRIPTION OF PREFERRED EMBODIMENTS OF THE INVENTION

Figure 1:
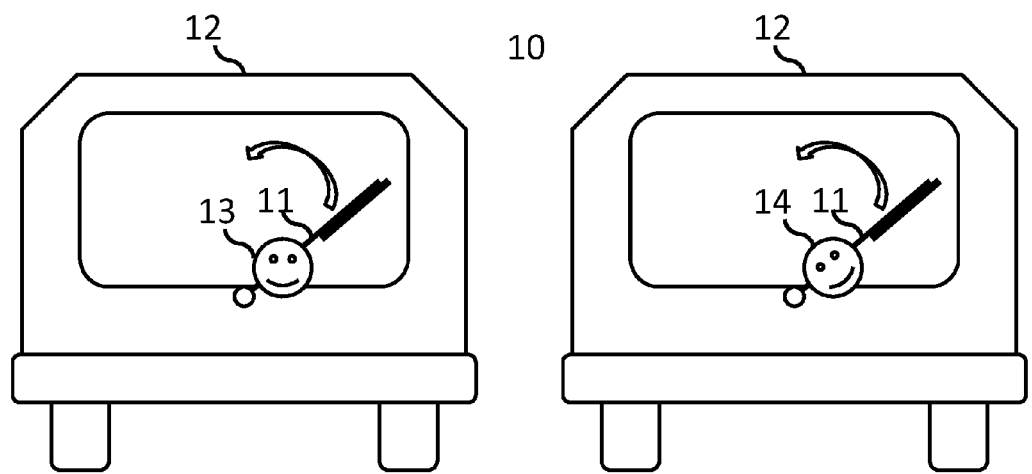
FIG. 1 is a non-limiting diagram showing the apparatus of the present invention as it may typically be positioned on a wiper arm of a windshield wiper system located on the rear of a sport utility vehicle, and how the text and graphics presented on the display panel may remain relatively level during rotational motion of the wiper arm, provided the display-connector is position asymmetrically and/or the lower portion of the display panel is weighted.

In brief: FIG. 1 is a non-limiting drawing showing the apparatus of the present invention as it may typically be positioned on a wiper arm of a windshield wiper system located on the rear of a sport utility vehicle, and how the text and graphics presented on the display panel may remain relatively level during rotational motion of the wiper arm, provided the display-connector is connected as a rotation-point connector positioned asymmetrically and/or the lower portion of the display panel is weighted. If the display-connector is substantially centered on the back side of the display panel, and the display panel is not asymmetrically weighted, the orientation of the display panel will remain substantially unchanged with respect to the wiper arm as the wiper arm moves rotationally during operation of the windshield wiper system.

Figure 2:
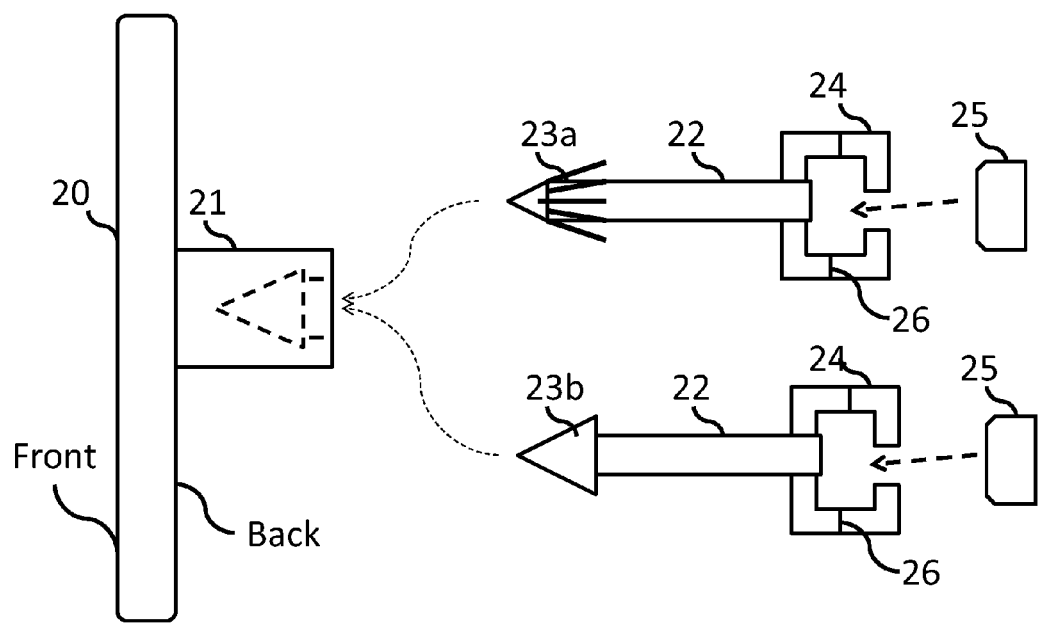
FIG. 2 is a non-limiting diagram showing the display panel with a display-connector positioned substantially centered on the back side and two configurations of the shaft with shaft-connector and arm-connector.

FIG. 2 is a non-limiting diagram showing the display panel with a display-connector positioned substantially centered on the back side and two configurations of the shaft with shaft-connector and arm-connector. The display-connector affixes the shaft to the display panel, the display-connector comprising the connector positioned on the display panel backside. The shaft-connector and the display-connector are configured to lock together after one is connected to the other, preventing separation of the display panel from the shaft during motion of the automotive wiper arm. The arm-connector is configured to clasp the automotive wiper arm and maintain sufficient pressure to avoid rotation of the shaft around and generally perpendicular to the automotive wiper arm.

Figure 3:
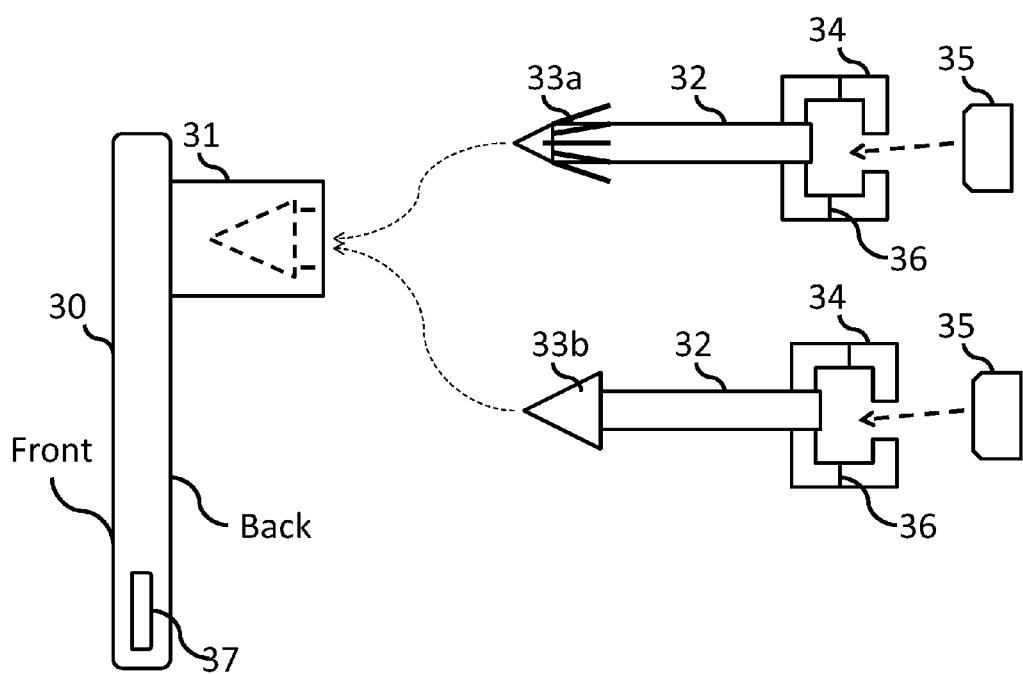
FIG. 3 is a non-limiting diagram showing the display panel with an asymmetrically positioned display-connector on the back side and two configurations of the shaft with shaft-connector and arm-connector.

FIG. 3 is a non-limiting diagram showing the display panel with an asymmetrically positioned display-connector on the back side and two configurations of the shaft with shaft-connector and arm-connector. The display-connector affixes the shaft to the display panel, the display-connector comprising the connector positioned on the display panel backside. The shaft-connector and the display-connector are configured to lock together after one is connected to the other, preventing separation of the display panel from the shaft during motion of the automotive wiper arm. The arm-connector is configured to clasp the automotive wiper arm and maintain sufficient pressure to avoid rotation of the shaft around and generally perpendicular to the automotive wiper arm.

Figure 4:
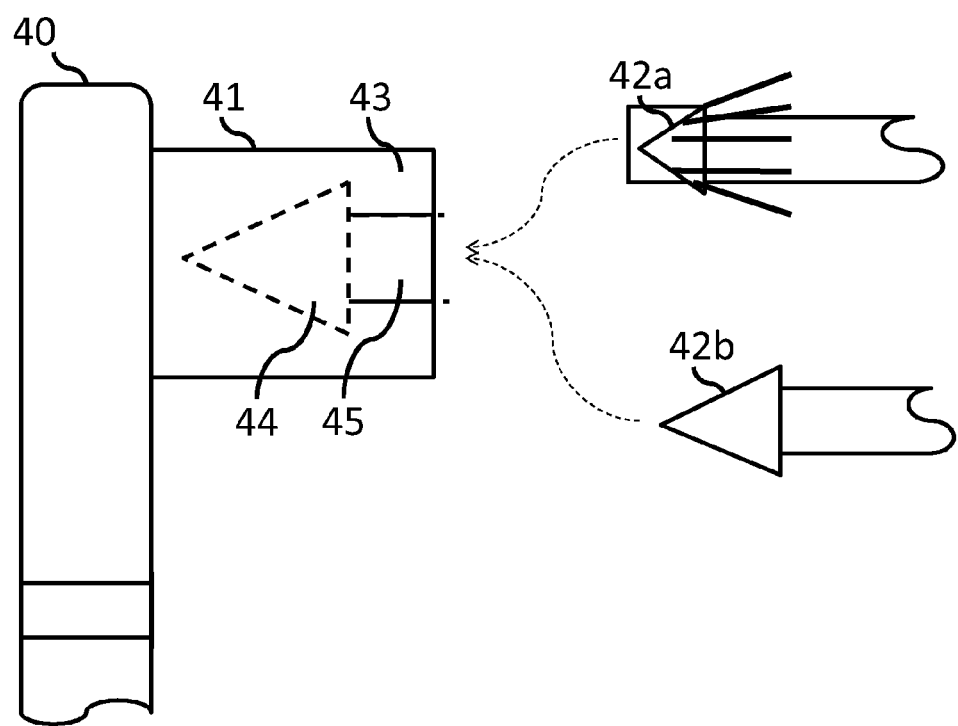
FIG. 4 is a diagram showing a non-limiting cross-section of a display-connector positioned on the back side of the display panel.

FIG. 4 is a non-limiting diagram showing the cross-section of the display-connector on the back side of the display panel. The display-connector is conical in shape and configured to receive the shaft-connector. The display-connector further comprises an integrated base ring situated at the base dimension of the conical shaped receptor, the base ring having an inner circular opening with a diameter less than the base diameter of the conical shaped receptor.

Figure 5:
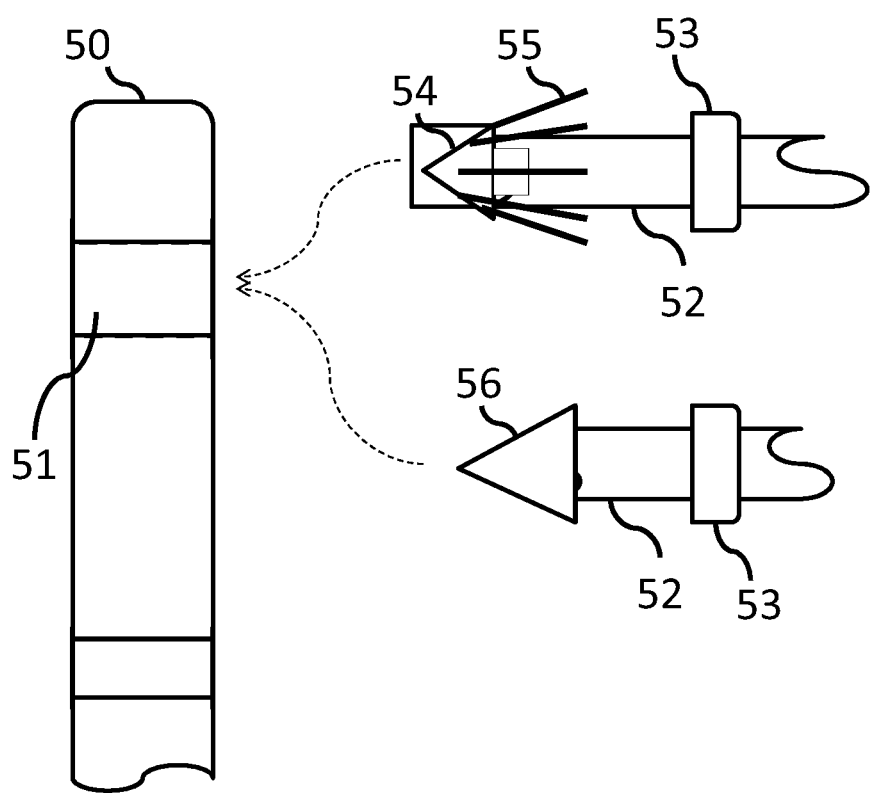
FIG. 5 is a diagram showing a non-limiting cross section of a display-connector penetrating through the display panel and a configuration of the shaft with a diameter enlargement providing a stop for the display panel.

FIG. 5 is a non-limiting diagram showing the cross section of a display-connector penetrating through the display panel and a configuration of the shaft with a diameter enlargement providing a stop for the display panel. The shaft is shown configured with a conical shaped tip having an apex at a forward end situated away from the shaft and a plurality of flexible tip extenders divided from each other and extending angularly back toward the shaft and away from the conical shaped tip, the plurality of point extenders configured in a conical shape having an apex comprised of the conical shaped tip and a base diameter at outer ends of the point extenders greater than a shaft diameter at the point where the first rotation-point connector and the shaft are fastened together.

Figure 6:
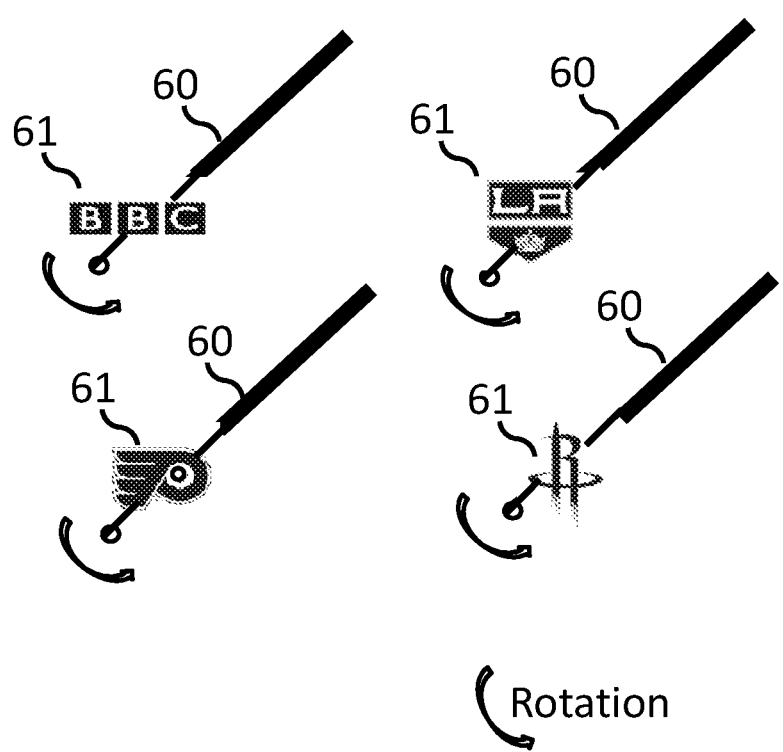
FIG. 6 is a diagram showing four non-limiting examples of display panels of various shapes each mounted on an automotive wiper arm.

FIG. 6 is a non-limiting diagram showing four examples of display panels of various shapes each mounted on an automotive wiper arm. The display panels are shown relatively level with respect to the ground while the wiper arm is rotating from right to left.

Figure 7:
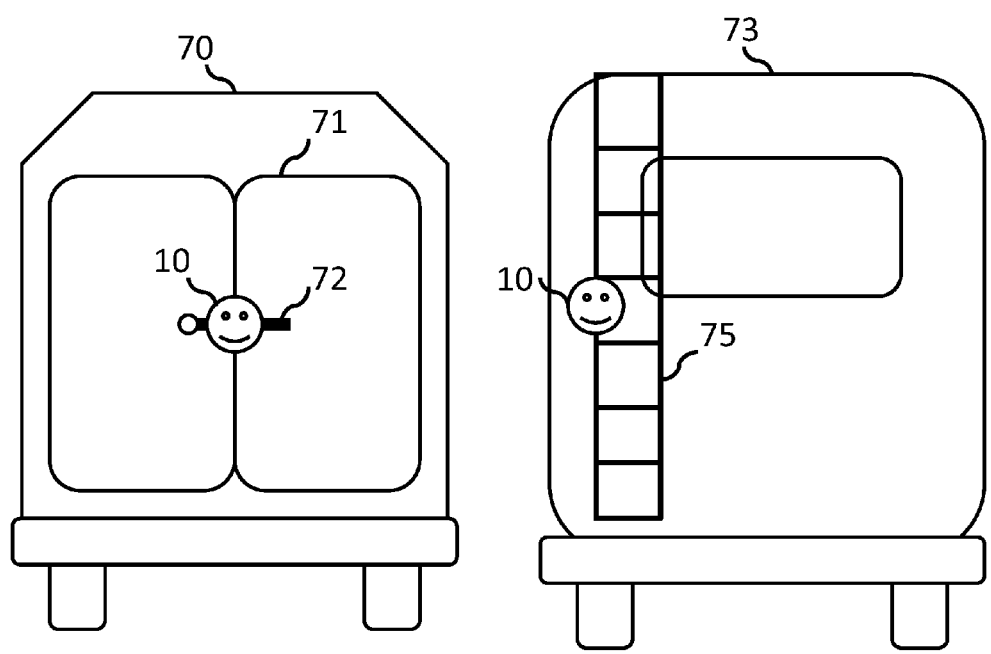
FIG. 7 is a non-limiting diagram showing the apparatus of the present invention mounted on other attachment points of an automotive vehicle.

FIG. 7 is a non-limiting diagram showing the apparatus of the present invention mounted on other attachment points of an automotive vehicle. The arm-connector of the shaft positioned on the back-side of the display panel (see FIG. 2) is configured to clasp the attachment points and maintain sufficient pressure to avoid rotation of the shaft around and generally perpendicular to the automotive wiper arm.

Figure 8A:
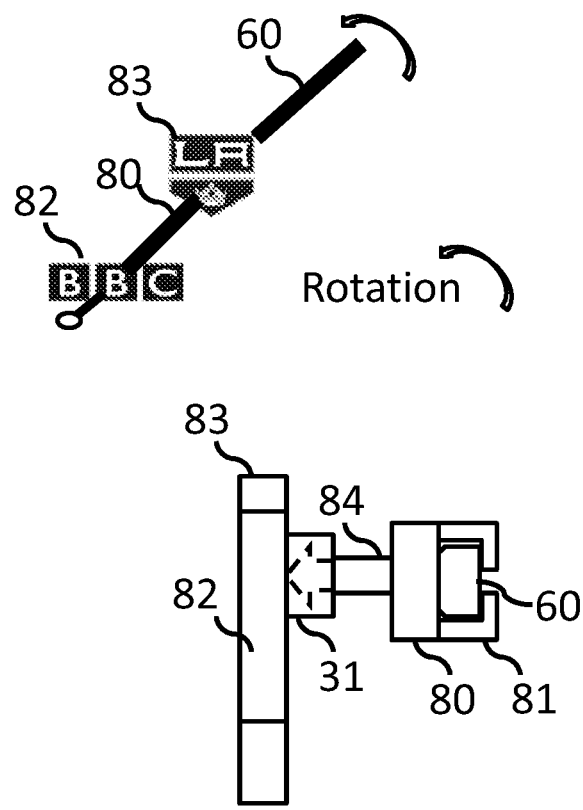
FIG. 8A is a non-limiting diagram showing the apparatus of the present invention mounted on a wiper arm and configured with two display panels.

FIG. 8A is a non-limiting diagram showing the apparatus of the present invention mounted on a wiper arm and configured with two display panels. An end-view of a dual shaft connector bar is presented showing one of two arm-connectors attached to a wiper arm also shown in end-view.

Figure 8B:
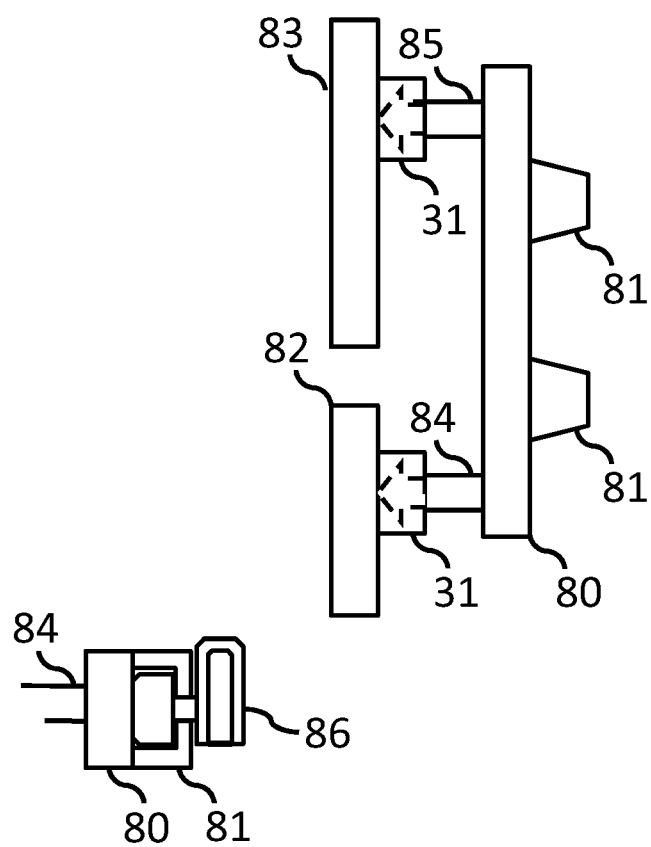
FIG. 8B is a non-limiting diagram showing a top-view of a dual shaft connector bar with shaft connectors inserted into display-connectors positioned on the back side of two display panels; a connector adaptor is also shown.

FIG. 8B is a non-limiting diagram showing a top-view of a dual shaft connector bar with shaft connectors inserted into display-connectors positioned on the back side of two display panels. The dual shaft connector bar is also shown in end-view with a connector adaptor inserted into one of two arm connectors, the second arm connector not being visible in the end-view. The connector adaptor may be used to adapt the arm-connector to various attachment points on an automotive vehicle.

Figure 9:
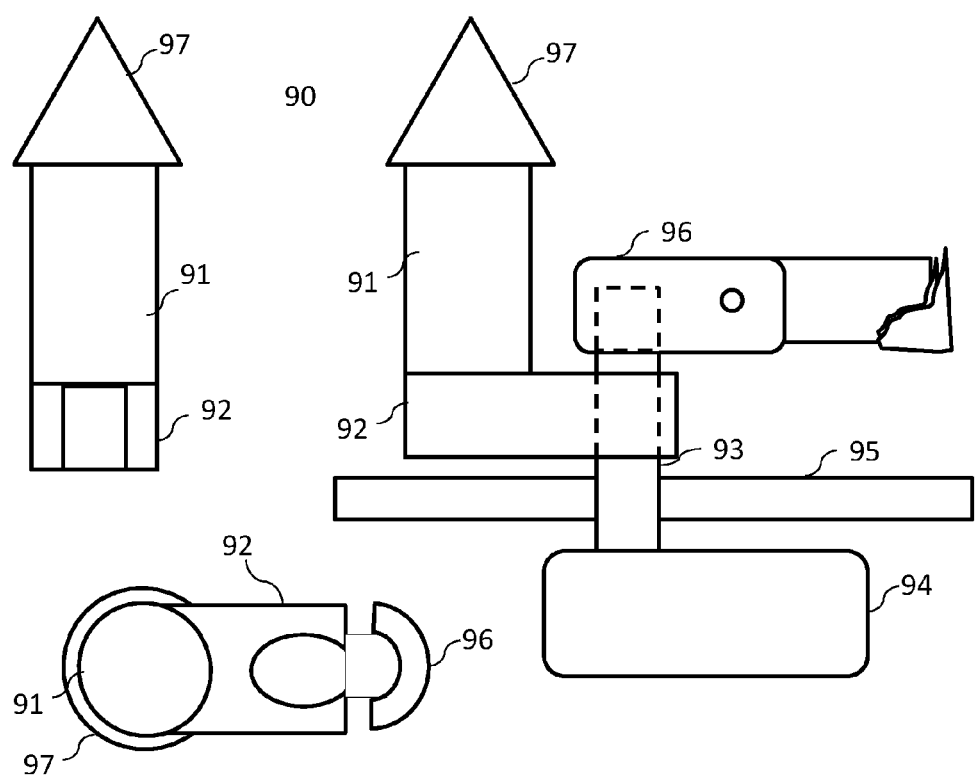
FIG. 9 is a non-limiting diagram showing a right-angled shaft configuration with shaft-connector and a snap-connector for connecting to a wiper motor shaft.

FIG. 9 is a non-limiting diagram showing a right-angled shaft configuration with shaft-connector and a snap-connector for connecting to a wiper motor shaft. The right-angled shaft is shown connected to a wiper motor shaft in a location between the wiper motor and the point of wiper arm attachment to the wiper motor shaft. The right-angled shaft configuration may be used to mount relatively heavier and larger size display panels without impeding wiper arm rotational motion.

In detail: Referring now to FIG. 1, there is shown a non-limiting schematic illustration of one embodiment of the present invention 10 illustrating how the apparatus of the present invention may typically be positioned on a wiper arm 11 of a windshield wiper system located on the rear 12 of a sport utility vehicle, and how text and graphics presented on the display panel 13 may remain relatively level during rotational motion of the wiper arm 11, provided the display-connector is position asymmetrically and or the lower portion of the display panel 13 is weighted. If the display-connector is substantially centered on the back side of the display panel 14, and the display panel 14 is not asymmetrically weighted, the orientation of the display panel 14 and displayed text or graphics will remain substantially unchanged with respect to the wiper arm 11 as the wiper arm moves rotationally during operation of the windshield wiper system. Weighting the lower portion of the display panel 14 would tend to maintain a level orientation as shown for display panel 13.

According to a one aspect, the present invention 10 as shown in FIG. 1 provides a display device 13 mountable on an automotive wiper arm 11, comprising a display panel (FIG. 2, 20) having a front side for presentation of text or graphics and a back side for mounting a connector. Referring to FIG. 2, an arm-connector 24 is used for affixing the display device (FIG. 1, 13) to the automotive wiper arm 25 (or alternative attachment point), and a shaft links the arm-connector 24 to the display panel 20. A shaft-connector provides for affixing the shaft 22 to the display panel 20, the shaft-connector comprising part of the shaft 22. A display-connector 21 affixes the shaft 22 to the display panel 20, the display-connector 21 comprising the connector positioned on the display panel 20 backside. Depending on the weight and/or configuration of the display panel, mere than one arm connector may be needed and employed.

In other aspects of the present invention, the display-connector 21 may be positioned on the backside of the display panel 20 as needed to fit the shape of the display panel 20 which may be configured three dimensionally to fit the shape of text or graphics to be presented. The display panel may be fabricated using a translucent material suitable for illumination using light emitting diodes (LED) powered by a battery installed in the shaft or internally in the display panel. Depending on the weight and/or configuration of the display panel, more than one display connector may be needed and employed.

In another aspect of the present invention, the display panel 20 may comprise a digital display enabling dynamic presentation or reconfiguration of text and/or graphics on the display panel 20, and which digital display 20 may be powered by an internal battery, connection to the vehicle electrical system, solar cells mounted on the display panel 20, or a combination of these power sources.

Referring now to FIG. 2, there is shown a non-limiting schematic illustration of one embodiment of the present invention showing the display panel 20 with a display-connector 21 positioned substantially centered on the back side and two different configurations of the shaft 22 with shaft-connectors 23a and 23b and arm-connector 24. The display-connector 21 affixes the shaft 22 to the display panel 20, the display-connector 21 accepting the shaft-connector. The shaft-connectors 23a and 23b and the display-connector 21 are configured to lock together after one is connected to the other, preventing separation of the display panel 20 from the shaft 22 during motion of an automotive wiper arm 25 (shown in cross-section) to which it may be attached by the arm-connector 24. The arm-connector 24 is configured to clasp an automotive wiper arm 25 or other connection point on an automotive vehicle and maintain sufficient pressure to avoid rotation of the shaft 22 around and generally perpendicular to the automotive wiper arm 25 or other connection point. Locking fasteners 26 may also be optionally used to help secure the arm-connector 24 to an automotive wiper arm 25.

In another aspect of the present invention, the shaft 22 and arm-connector 24 may be comprised of relatively rigid plastic material, such as No. 2 durable plastic, having a total length in the range of 3 to 6 inches, and a shaft diameter in the range of 0.5 to 1.0 inch. In another aspect of the present invention, the shaft-connectors 23a or 23b, arm-connector 24, and shaft 22 may be configured from molded plastic as a single piece. The shaft may be configured to accept a battery.

Referring now to FIG. 3, there is shown a non-limiting schematic illustration of one embodiment of the present invention showing the display panel 30 with an asymmetrically positioned display-connector 31 on the back side and two configurations of the shaft 32 with shaft-connectors 33a and 33b and arm-connector 34. The display-connector affixes the shaft 32 to the display panel 30, the display-connector 31 accepting the shaft-connector. The shaft-connectors 33a and 33b and the display-connector 31 are configured to lock together after one is connected to the other, preventing separation of the display panel 30 from the shaft 32 during motion of an automotive wiper arm 35 (shown in cross-section) to which it may be attached by the arm connector 34. The arm-connector 34 is configured to clasp an automotive wiper arm 35 and maintain sufficient pressure to avoid rotation of the shaft 32 around and generally perpendicular to the automotive wiper arm 35 as a result of airflow pressure on the display panel during vehicular motion. The shape of the arm-connector 34 may be configured in shapes that closely fit the cross-sectional shape of various models of automotive wiper arms 35. Locking fasteners 36 may also be used to help secure the arm-connector 34 to an automotive wiper arm 35.

In another aspect of the present invention referring to FIG. 3, the shaft-connectors 33a and 33b and the display-connector 31 may be rotation-point connectors configured to allow the display panel 30 to rotate on the shaft 32. Asymmetric mounting and use of rotation point connectors serves to maintain orientation of the text or graphics present on the display panel relatively level with respect to the ground during rotational movement of the automotive wiper arm 35. Optionally, a weight 37 may be incorporated on or into the lower portion of the display panel substantially opposite the display-connector 31 to create a righting moment during rotational movement of the automotive wiper arm 35.

In another aspect of the present invention, the shaft 32 and arm-connector 34 may be comprised of relatively rigid plastic material, such as No. 2 durable plastic, having a total length in the range of 3 to 6 inches, and a shaft diameter in the range of 0.5 to 1.0 inch. In another aspect of the present invention, the shaft-connectors 33a or 33b, arm-connector 34, and shaft 32 may be configured from molded plastic as a single piece.

Referring now to FIG. 4, there is shown a non-limiting schematic illustration of one embodiment of the present invention showing the cross-section of the display-connector 41 asymmetrically mounted on the back side of the display panel 40. The display-connector 41 is internally conical in shape and configured to receive the shaft-connector 42a or 42b. The display-connector 41 further comprises an integrated base ring 43 situated at the base dimension of the conical shaped receptor 44, the base ring having an inner circular opening 45 with a diameter less than the base diameter of the conical shaped receptor 44.

In another aspect of the present invention, the display panel 40 is comprised of a plastic material and may be configured with raised ridges on the backside to stiffen the display panel 40, the raised ridges radiating out from the display-connector 41. The display panel 40 may also be shaped three dimensionally to substantially conform to the shape of text and/or graphics presented on said display panel 40. The display panel 40 may comprise light reflective material. The display panel 40 may comprise translucent material suitable for internal illumination.

Referring now to FIG. 5, there is shown a non-limiting schematic illustration of one embodiment of the present invention showing the cross section of a display-connector 51 penetrating through the display panel 50 and a configuration of the shaft 52 with a diameter enlargement 53 providing a stop for the display panel 50. The shaft 52 is shown configured with a conical shaped tip 54 having an apex at a forward end situated away from the shaft 52 and a plurality of flexible tip extenders 55 divided from each other and extending angularly back toward the shaft 52 and away from the conical shaped tip 54, the plurality of tip extenders 55 configured in a conical shape having an apex comprised of the conical shaped tip 54 and a base diameter at outer ends of the tip extenders 55 greater than a shaft 52 diameter at the point where the display-connector and the shaft 52 are fastened together. A shaft 52 is also shown configured with the diameter enlargement 53 and a conical tip connector 56 having a base diameter sized to permit an initial insertion and connection to be made with the display-connector 51, and sufficiently larger than the diameter of the display-connector 51 to maintain the connection during operation of a windshield wiper system. The display panel 50 may be shaped to substantially conform to the shape of text and/or graphics presented on said display panel 50.

In another aspect of the present invention, the display panel 50 may be comprised of semi-flexible plastic material and may have a thickness in the range of 0.25 inches to 0.75 inches, the thickness being needed to maintain shape of the display panel 50 depending on the stiffness characteristics of the semi-flexible plastic and the shape of the display panel 50.

In another aspect of the present invention, the display panel 50 may be comprised of relatively rigid plastic material having a thickness in the range of 0.2 inches to 0.6 inches, the thickness being needed to maintain shape of the display panel 50 depending on the stiffness characteristics of the rigid plastic and the shape of the display panel 50. The Display panel 40 may comprise light reflective material. The display panel 40 may comprise translucent material suitable for internal illumination.

Referring now to FIG. 6, there is shown a non-limiting schematic illustration of one embodiment of the present invention showing four examples of display panels of various shapes each mounted on an automotive wiper arm 60. The display panels 61 are shown relatively level with respect to the ground while the wiper arm 60 is rotating from right to left. The display panel 61 will tend to remain relatively level during rotational motion of the wiper arm 60, provided the display-connector is connected as a rotation-point connector positioned asymmetrically and/or the lower portion of the display panel 61 is weighted. The display panels 61 may be shaped three dimensionally to conform substantially with the shape of the text or graphics presented, and may further comprise light reflective material or translucent. The display panel 61 and the display-connector may be configured from molded plastic as a single piece.

Referring now to FIG. 7, there is shown a non-limiting diagram of the apparatus of the present invention 10 mounted on other attachment points of two types of automotive vehicles. The vehicles shown are a panel truck 70 with swing open doors 71 having a locking lever 72 used as an attachment point; and a recreational vehicle 73 having a vertical ladder 75 used as an attachment point. Various attachment points on other types of vehicles and various configurations of the display panel of the present invention 10 are also anticipated. Attachment points may be rotational or non-rotational relative to the vehicle. Display panels may be configured in various shapes and sizes as needed to present a particular graphic or text message.

Referring now to FIG. 8A there is shown a non-limiting diagram of the apparatus of the present invention mounted on a wiper arm 60 and configured with a first display panel 82 and a second display panel 83. An end-view of a dual shaft connector bar 80 is presented showing one of two arm-connectors 81 attached to a wiper arm 60 also shown in end-view. The display-connector 31 positioned on the back of display panel 82 is shown with a shaft connector of one shaft 84 of the dual shaft connector bar 80 inserted. The second display panel 83 is shown in partial view behind the first display panel 82.

Referring now to FIG. 8B there is shown a non-limiting diagram of a top-view of a dual shaft connector bar 80 with shaft connectors inserted into display-connectors 31 positioned on the back side of a first display panel 82 and a second display panel 83. The dual shaft connector bar 80 is shown configured with two arm connectors 81. Shaft 84 connects the first display panel 82 to the dual shaft connector bar 80, Shaft 85 connects the second display panel 83 to the dual shaft connector bar 80. The dual shaft connector bar 80 is also shown in end-view with a connector adaptor 86 inserted into one of the two arm connectors 81, the second arm connector 81 not being visible in the end-view. The connector adaptor 86 may be used to adapt the arm-connector 81 to various attachment points on an automotive vehicle. A connector adaptor 86 as shown may be used to connect the dual shaft connector bar 80 to a connection point such as the top edge of a side window or a sun visor above the front wind shield on an automotive vehicle. A connector adaptor 86 as shown may also be used to adapt a shaft connector of a single shaft for attachment to a side window or sun visor of an automotive vehicle.

FIG. 9 is a non-limiting diagram showing a right-angled shaft configuration with shaft 91 having a shaft-connector 97 and a snap-connector 92, the snap-connector 92 for connecting to a wiper motor shaft 93. The snap-connector 92 is shown connected to a wiper motor shaft 93 in a location between the wiper vehicle exterior surface 95. The snap-connector 92 may be configured to slide onto the wiper motor shaft 93 and clasp the shaft 93 with sufficient tension to remain in position during wiper motor operation and vehicle motion. A locking strap 96 may also be employed to close the open end of the snap connector 92 and completely surround the wiper motor shaft 93. The right-angled shaft configuration may be used to mount relatively heavier and larger size display panels without impeding wiper arm rotational motion.

The present invention provides a new medium that can be ideally positioned on an automotive vehicle for increased brand promotion and connectivity with fans in the licensed brand products market, including sports, popular music, and corporate image. Presentation of names, mottos, and logos related to promotion of all sports, popular music, corporate brands, entertainment events, movie characters, television programming, political candidates, and personal messages are anticipated. This medium provides a new way to directly deliver brand and personal messages on the road every day, as well as to participants in tailgating or any outdoor entertainment event. Text and graphics can be presented three dimensionally for licensed-products sales, including all brands associated with the National Football League (NFL), Major League Baseball, Collegiate sports (NCAA), the National Basketball Association (NBA), National Association for Stock Car Auto Racing (NASCAR), the National Hockey League (NHL), and American Motorcycle Association Pro Racing. Minor league and amateur sports teams, as well as individual athletes can be promoted. Anything for which fans have a passion is anticipated.

The present invention provides a new medium for expressing personal messages and end user passion through pre-configured text and graphics, or alternatively custom designed text and graphics. For added impact, the display panel may be illuminated by an internal or external light source such as Light-Emitting-Diodes powered by batteries, solar cells, vehicle power, or a combination of these. Dynamic presentation of text and graphics on automotive vehicles can be enabled in a new way by configuring the display panel of the present invention as an electronic display controlled by pre-programmed instruction sets stored in non-transient memory incorporated in the display panel. Alternatively, said instruction sets may be received from a remote source by a wireless communication device electronically connected to the display panel, and written into said memory. The present invention may be attached at least to the rear wiper arm of any of the millions of sport utility vehicles (SUVs) and crossover vehicles in operation and manufactured every year. The present invention may also be attached to millions of other vehicles, including trucks (private and commercial), recreational vehicles, public buses, personal transport vehicles, motorcycles, and golf cars.

While specific embodiments of the present invention have been described and illustrated, it will be apparent to those skilled in the art that numerous modifications and variations can be made without departing from the scope of the invention as defined in the appended claims. It is understood that the words that have been used are words of description and illustration, rather than words of limitation. Although the invention has been described with reference to particular means, materials and embodiments, the invention is not intended to be limited to the particulars disclosed; rather, the invention extends to all functionally equivalent structures, methods and uses, such as are within the scope of the appended claims.

We claim:

1. A display device mountable on an automotive wiper arm positioned on a rear windshield wiper assembly of an automotive vehicle, said wiper assembly including a motor, a motor-shaft, wiper arm, and wiper blade, comprising:

a display panel having a front side for presentation of text or graphics and a back side for positioning a connector;

an arm-connector for affixing said display device to said automotive wiper arm;

a shaft for linking said arm-connector to said display panel;

a shaft-connector for affixing said shaft to said display panel, said shaft-connector comprising part of said shaft;

a display-connector for affixing said shaft-connector to said display panel, said display-connector positioned on or penetrating through said display panel backside;

wherein said arm-connector is configured to attach to said automotive wiper arm and maintain sufficient connective pressure to avoid substantial rotation of said shaft around said automotive wiper arm as a result of airflow pressure on said display panel during vehicular motion;

wherein said shaft-connector is a first rotation-point connector and said display-connector is a second rotation-point connector, and said second rotation-point connector is positioned asymmetrically on said display panel;

wherein said first rotation-point connector is configured to insert into said second rotation-point connector and lock into said second rotation-point connector substantially preventing separation after connecting said first rotation-point connector to said second rotation-point connector, and wherein said first and second rotation-point connectors are configured to allow said display panel to rotate with respect to said shaft during rotational movement of said automotive wiper arm.

2. The display device of claim 1, wherein said first rotation-point connector is conical in shape having an apex at a forward end away from said shaft and a base diameter greater than a shaft diameter at the point where said first rotation-point connector and said shaft are fastened together.

3. The display device of claim 2, wherein said second rotation-point connector comprises a conical shaped receptor configured to receive said first rotation-point connector, said second rotation-point connector further comprising an integrated base ring situated at the base dimension of said conical shaped receptor, said base ring having an inner circular opening with a diameter less than said base diameter.

4. The display device of claim 1, wherein said display panel is weighted to promote a pendulum effect substantially positioning the second rotation-point connector above a lower portion of said display throughout the range of motion of said automotive wiper arm during operation.

5. The display device of claim 1, wherein said first rotation-point connector comprises a conical shaped tip having an apex at a forward end situated away from said shaft and a plurality of flexible tip extenders divided from each other and extending angularly back toward said shaft and away from said conical shaped tip, said plurality of point extenders configured in a conical shape having an apex comprised of said conical shaped tip and a base diameter at outer ends of said point extenders greater than a shaft diameter at the point where said first rotation-point connector and said shaft are fastened together.

6. The display device of claim 5, wherein said second rotation-point connector comprises a conical shaped receptor configured to receive said first rotation-point connector, said second rotation-point connector further comprising an integrated base ring situated at the base dimension of said conical shaped receptor, said base ring having an inner circular opening with a diameter less than said base diameter comprised of said outer ends of said point extenders.

7. A display system mountable on a rear windshield wiper assembly of an automotive vehicle, said wiper assembly including a motor, a motor-shaft, wiper arm, and wiper blade, said display system comprising:

a display panel having a front side for presentation of at least one of text and graphics and a back side for positioning a display-connector;

a plurality of linking-connectors for affixing said display panel to said rear windshield wiper assembly, each said linking-connector configured with an assembly-connector, a shaft, and a shaft-connector, said assembly-connector for connecting said shaft to said wiper assembly, and said shaft-connector for connecting said shaft to said display-connector;

wherein said display-connector comprises part of said display panel;

wherein said plurality of linking-connectors include linking connectors connectable to said motor-shaft or said wiper-arm;

wherein said shaft-connector and said display-connector are configured to lock together after one is connected to the other, preventing separation of said display panel from said shaft during motion of said automotive vehicle and motion of said wiper arm of said windshield wiper assembly, and wherein said assembly-connector is configured to clasp said windshield wiper assembly and maintain sufficient pressure to avoid disconnecting as a result of airflow pressure on said display panel during vehicular motion or said motor-shaft rotation.

8. The display system of claim 7, wherein at least one of said plurality of linking connectors is configured for affixing said display panel to said wiper arm of said windshield wiper assembly.

9. The display system of claim 7, wherein at least one of said plurality of linking connectors is configured for affixing said display panel to said motor-shaft of said windshield wiper assembly.

10. The display system of claim 7, wherein said display-connector is positioned asymmetrically on said display panel backside and comprises part of said display panel.

11. The display system of claim 7, wherein said display-connector penetrates through said backside of said display panel.

12. The display system of claim 7, wherein said shaft-connector is a first rotation-point connector and said display-connector is a second rotation-point connector, said first rotation-point connector is configured to insert into said second rotation-point connector; wherein said first and second rotation-point connectors are configured to allow said display panel to rotate with respect to said shaft during rotational movement of said motor-shaft, and wherein visual orientation of said text or said graphics present on said display panel is maintained relatively unchanged with respect to the ground during operation of said windshield wiper assembly.

13. The display system of claim 12, wherein said display panel is weighted to promote a pendulum effect substantially maintaining positioning of the second rotation-point connector above a lower portion of said display throughout the range of motion of said automotive wiper arm during operation.

14. The display system of claim 12, wherein said first rotation-point connector is conical in shape having an apex at a forward end away from said shaft and a base diameter greater than a shaft diameter at the point where said first rotation-point connector and said shaft are fastened together, and wherein said second rotation-point connector comprises a conical shaped receptor configured to receive said first rotation-point connector, said second rotation-point connector further comprising an integrated base ring situated at the base dimension of said conical shaped receptor, said base ring having an inner circular opening with a diameter less than said base diameter.

15. The display system of claim 12, wherein said first rotation-point connector comprises a conical shaped tip having an apex at a forward end situated away from said shaft and a plurality of flexible tip extenders divided from each other and extending angularly back toward said shaft and away from said conical shaped tip, said plurality of point extenders configured in a conical shape having an apex comprised of said conical shaped tip and a base diameter at outer ends of said point extenders greater than a shaft diameter at the point where said first rotation-point connector and said shaft are fastened together, and wherein said second rotation-point connector comprises a conical shaped receptor configured to receive said first rotation-point connector, said second rotation-point connector further comprising an integrated base ring situated at the base dimension of said conical shaped receptor, said base ring having an inner circular opening with a diameter less than said base diameter comprised of said outer ends of said point extenders.

16. The display system of claim 12, wherein said display panel is comprised of plastic material having a thickness preferably in the range of 0.25 inches to 1.5 inches, the thickness needed to maintain shape of said display panel depending on the stiffness characteristics of said plastic and the shape of the display panel.

17. The display system of claim 16, wherein said display panel further comprises one of translucent or light reflective material.

18. The display system of claim 16, wherein said display panel is shaped to substantially conform to the shape of text and graphics presented on said display panel.

19. The display system of claim 12, wherein the display panel further comprises a digital display enabling dynamic presentation or reconfiguration of text and/or graphics on the display panel, and which digital display may be powered by an internal battery, connection to the vehicle electrical system, solar cells mounted on the display panel, or a combination of these power sources.

20. The display system of claim 19, wherein operation of said display panel is controlled from a wireless device capable of transmitting a control signal from said wireless device to said display panel and said display panel is configured to receive said control signal.

\* \* \* \* \*